(12) United States Patent
Bury et al.

(10) Patent No.: US 9,795,046 B2
(45) Date of Patent: Oct. 17, 2017

(54) DEVICE FOR SECURING A FUNCTIONAL COMPONENT TO A SUPPORT RAIL

(71) Applicant: Phoenix Contact GmbH & Co KG, Blomberg (DE)

(72) Inventors: Joachim Bury, Herford (DE); Thomas Salomon, Verl (DE)

(73) Assignee: Phoenix Contact GmbH & Co KG, Blomberg (DE)

(*) Notice: Subject to any disclaimer, the term of this patent is extended or adjusted under 35 U.S.C. 154(b) by 0 days.

(21) Appl. No.: 15/033,598

(22) PCT Filed: Nov. 3, 2014

(86) PCT No.: PCT/EP2014/073560
§ 371 (c)(1),
(2) Date: Apr. 29, 2016

(87) PCT Pub. No.: WO2015/063294
PCT Pub. Date: May 7, 2015

(65) Prior Publication Data
US 2016/0286675 A1 Sep. 29, 2016

(30) Foreign Application Priority Data

Nov. 4, 2013 (DE) .......................... 10 2013 112 117

(51) Int. Cl.
*H01R 9/26* (2006.01)
*H05K 7/02* (2006.01)
(Continued)

(52) U.S. Cl.
CPC .............. *H05K 7/10* (2013.01); *H01R 9/2608* (2013.01); *H05K 7/026* (2013.01); *H05K 7/1401* (2013.01);
(Continued)

(58) Field of Classification Search
CPC .......... H01R 4/64; H01R 9/26; H01R 9/2608; H01R 9/2691; H01R 13/506;
(Continued)

(56) References Cited

U.S. PATENT DOCUMENTS 5,480,310 A * 1/1996 Baum .................. H01R 9/2691
439/716
5,768,091 A 6/1998 Vinson et al.
(Continued)

FOREIGN PATENT DOCUMENTS

DE 3248124 A1 7/1984
DE 4402002 A1 7/1995
(Continued)

OTHER PUBLICATIONS

English Translation of EP1901598, (Klamm Arnold) Mar. 19, 2008.*
(Continued)

*Primary Examiner* — Chandrika Prasad
(74) *Attorney, Agent, or Firm* — Knobbe, Martens, Olson & Bear, LLP

(57) ABSTRACT

The invention concerns a functional component (400) for a component construction system (100) for electrical connection to a bridge module (300) which comprises a housing (421) with a component-securing arrangement (401) for securing the functional component (400) to a support profile rail (200).

13 Claims, 6 Drawing Sheets

(51) Int. Cl.
*H05K 7/10* (2006.01)
*H05K 7/14* (2006.01)

(52) U.S. Cl.
CPC ......... *H05K 7/1474* (2013.01); *H05K 7/1477* (2013.01); *H05K 7/1478* (2013.01)

(58) Field of Classification Search
CPC .............. H01R 13/514; H01R 13/5208; H01R 13/5202; H01R 13/5219; H01R 13/62; H01R 13/6271; H01R 27/02; H05K 7/026; H05K 7/10; H05K 7/206; H05K 7/1401; H05K 7/1441; H05K 7/1474; H05K 7/1477; H05K 7/1478; H05K 7/1465
USPC .............. 439/271, 351, 352, 532, 533, 716; 361/601, 622, 801, 810
See application file for complete search history.

(56) References Cited

U.S. PATENT DOCUMENTS

| | | | |
|---|---|---|---|
| 6,371,435 B1* | 4/2002 | Landis | H02B 1/052 248/694 |
| 6,704,815 B1* | 3/2004 | Morikawa | H01R 9/2675 700/19 |
| 8,834,194 B2* | 9/2014 | Sakai | F21V 29/22 439/345 |
| 2005/0231931 A1 | 10/2005 | Bergmann | |
| 2009/0194652 A1* | 8/2009 | Bury | H02B 1/21 248/222.11 |
| 2014/0113503 A1* | 4/2014 | Barber | H01R 9/2408 439/712 |
| 2016/0278228 A1* | 9/2016 | Bury | H01R 11/03 |
| 2016/0285216 A1* | 9/2016 | Bury | H01R 9/26 |
| 2016/0286674 A1* | 9/2016 | Bury | H05K 7/1441 |
| 2016/0286679 A1* | 9/2016 | Bury | H05K 7/1465 |
| 2016/0330869 A1* | 11/2016 | Williams | H05K 7/20472 |

FOREIGN PATENT DOCUMENTS

| | | |
|---|---|---|
| DE | 10012764 C2 | 7/2003 |
| DE | 102005028735 B4 | 7/2008 |
| DE | 102010033728 A1 | 5/2011 |
| DE | 102011101078 A1 | 11/2011 |
| DE | 19816170 C2 | 10/2012 |
| EP | 0661915 A1 | 7/1995 |
| EP | 1901598 A1 | 3/2008 |
| EP | 2157845 A1 | 2/2010 |

OTHER PUBLICATIONS

English Translation of EP 2157845 (Bleiweiss Heinz) Feb. 24, 2010.*

English translation of incoming written opinion PCT/EP2014/073560, Mar. 11, 2014.*

* cited by examiner

DEVICE FOR SECURING A FUNCTIONAL COMPONENT TO A SUPPORT RAIL

The present invention relates to a functional component for a component construction system for electrical connection to a bridge module of a component construction system.

Modern component construction systems in automation technology typically consist of a plurality of functional components that are arranged in a switch cabinet. The distributor functions for energy and data are implemented with separate plug systems. A set-up without switch cabinet is not possible, since peripheral devices with a star-shaped energy distribution hang close to the switch cabinet. If field bus concepts are used, in which individual components are put on back panels, high weight forces are exerted on the back panels.

The published document DE 30 30 906 A1 relates to a switching jumper plug. The switching jumper plug comprises in each case two jumpers each comprising two plug pins, jumpers that are held on a circuit board in the space between the plug pins in pairs, in each case parallel to one another, in a shared plug part made of insulation material for conducting paths.

The object underlying the invention it to provide a functional component for a component construction system that is easier to install.

This object is attained by the subject matter having the features according to the independent claim. Advantageous embodiments of the invention are the subject matter of the figures, the description and the dependent claims.

According to an aspect of the invention, the object is attained by a functional component for a component construction system for electrical connection to a bridge module, which comprises a housing with a component securing device for securing the functional component to a support profile rail. As a result, for example, the technical advantage is achieved that the assembly of the functional component is accelerated and simplified.

The component construction system can be a field bus system, for example.

In an advantageous embodiment, the housing is composed of a functional housing lower part and a functional housing upper part. As a result, for example, the technical advantage is achieved that the functional components can be assembled in a modular manner from different base components, in order to achieve in that way a different functionality depending on the functional housing upper part that is used.

In an additional advantageous embodiment, a peripheral sealing ring is arranged between the functional housing lower part and the functional housing upper part. As a result, for example, the technical advantage is achieved that penetration of moisture is prevented.

In an additional advantageous embodiment, the functional housing upper part comprises a frequency inverter and/or a power supply and/or a power supply.

In an additional advantageous embodiment, the housing comprises at least one recess for the insertion of an electrical plug-in section of a bridge module. As a result, for example, the technical advantage is achieved that a reliable electrical and mechanical connection between the bridge module and the functional component is established.

In an additional advantageous embodiment, the functional component comprises a first recess for the insertion of a first electrical plug-in section and a second recess for the insertion of a second electrical plug-in section. As a result, for example, the technical advantage is achieved that each respective bridge module can be placed on one of two sides of the functional component.

In an additional advantageous embodiment, the functional component comprises an insert section for insertion into a receiving groove of the bridge module, in order to absorb tensile forces of the functional component along the support profile rail. As a result, for example, the technical advantage is achieved that damage to the plug contacts by tensile forces is prevented.

In an additional advantageous embodiment, the functional component comprises a first insert section on a first housing side and a second insert section on an opposite housing side. As a result, for example, the technical advantage is achieved that the tensile forces of the functional component can be transferred efficiently and in a torque-free manner to the bridge module on two sides.

In an additional advantageous embodiment, the functional component comprises a first component securing device for a first support profile of the support profile rail and a second component securing device for a second support profile of the support profile rail. As a result, for example, the technical advantage is achieved that the functional component can be secured to the support profile rail on two sides.

In an additional advantageous embodiment, the component securing device comprises a slidable locking slide for engaging under the support profile rail. As a result, for example, the technical advantage is achieved that the functional component can be secured in a stable and simple manner.

In an additional advantageous embodiment, the locking slide can be slid on the functional component between a pushed forward locking position for engaging under the functional component on the support profile rail and a retracted release position for placement of the functional component on the support profile rail. As a result, for example, the technical advantage is achieved that the locking slide can be slid between two positions and that a simple handling is achieved.

In an additional advantageous embodiment, the locking slide comprises a compression spring for promoting the movement of the locking slide in the pushed forward locking position, by means of which by the locking slide braces itself against a housing wall of the functional component. As a result, for example, the technical advantage is achieved that a locking of the locking slide is facilitated.

In an additional advantageous embodiment, the locking slide comprises a locking arm for the engagement of the locking slide in the locking position and for the engagement of the locking slide in the release position. As a result, for example, the technical advantage is achieved that an inadvertent release from the locking position or from the release position is prevented.

In an additional advantageous embodiment, the locking slide comprises a fixing spring arm for fixing the locking slide in the release position. As a result, for example, the technical advantage is achieved that the locking arm cannot be moved inadvertently into the locking position.

In an additional advantageous embodiment, the fixing spring arm comprises a pressure element for pressing the fixing spring arm in a disengage position in which the locking slide can be slid into the locking position. As a result, for example, the technical advantage is achieved that the locking arm can be moved in a simple manner into the disengage position.

In an additional advantageous embodiment, the locking slide comprises an opening for the insertion of a tool, in order to slide the locking slide. As a result, for example, the technical advantage is achieved that the locking slide can be slid using greater force.

In an additional advantageous embodiment, the functional component comprises a heat sink for the dissipation of heat.

Embodiment examples of the invention are represented in the drawings and described in further detail below.

Figure 1:
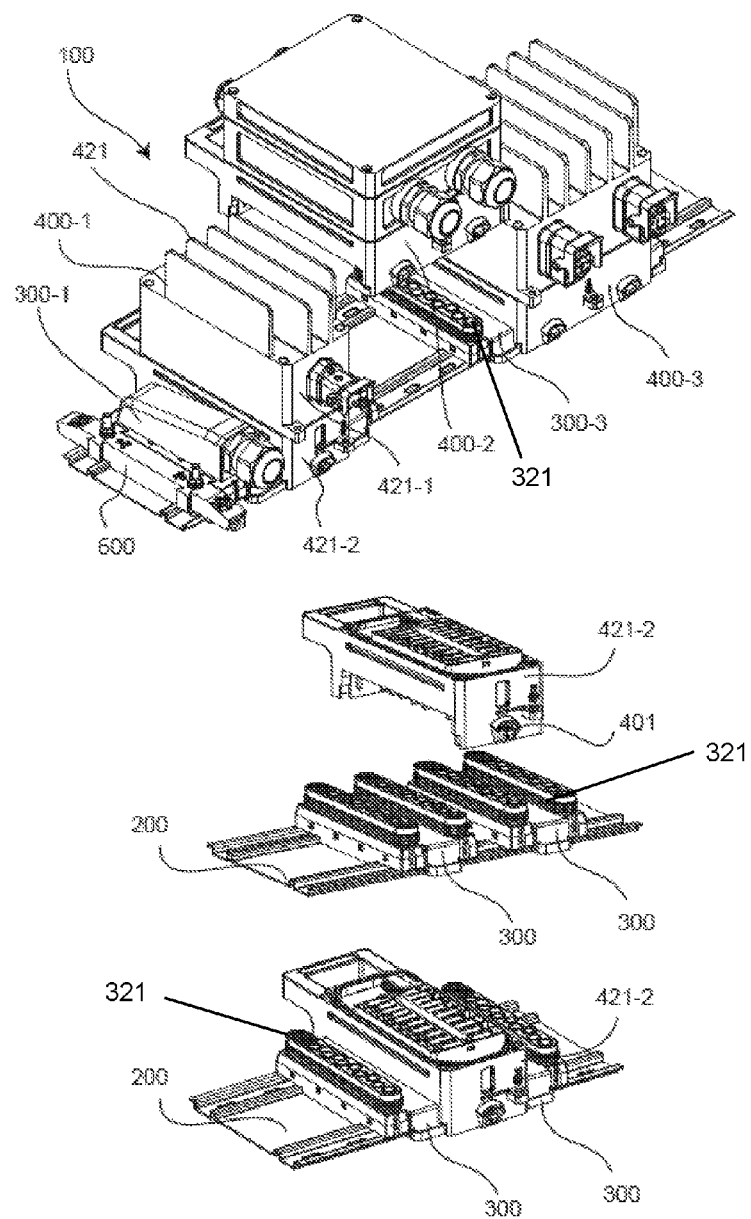
FIG. 1 shows different views of a component construction system.

FIG. 1 shows a cross-sectional view of a component construction system 100. The component construction system 100 is composed of a housing kit that can be plugged together, in which the functional components 400-1, 400-2 and 400-3 snap onto a support profile rail 200. The construction concept of the component construction system 100 comprises a support profile rail 200 as mounting platform, the bridge modules 300-1 and 300-3, and the functional components 400, each consisting of a housing 421 with a functional housing lower part 421-2 as connecting lower part and a functional housing upper part 421-1 as functional upper part.

Depending on the application purpose, different designs of the construction concept can be implemented. The construction concept can be broadened endlessly. The internal electrical connections for energy distribution of 400 V or 24 V, for example, and the data bus are implemented simultaneously with plugging together of the components. The connection functions are implemented in the functional housing lower part 421-2 of the functional components 400-1 to 400-3 and in the bridge modules 300-1 and 300-2. The functions of supplying, protecting, switching result from the sequence of the arrangement of the functional components 400-1 to 400-3. The user functions such as, for example, supplying, protecting or switching, are implemented in the functional housing upper part 421-1, which is connected to the functional housing lower part 421-2 via plug contacts.

The functional housing upper part 421-1 has a defined mechanical and electrical interface with the functional housing lower part 421-2 and can also be used on other functional housing lower parts 421-2 with the same interface. The functional housing lower part 421-2 contains only the connection technology. The functional housing upper part 421-1 contains, for example, the functions of disconnection, protecting and switching. The direction of action of the above-mentioned functions occurs, depending on the functional housing upper part 421-1 and the functional housing lower part 421-2, in the line and/or into the consumer output, i.e., in a plug connection in the functional connection upper part 421-1. The connection technology can be interrupted in the functional housing lower part 421-2.

The support profile rail 200 forms a single-piece support system with a broad rail for a rack construction that replicates the geometry of the contact edges of the bridge module 300-1 and 300-3 and of the functional components 400-1 to 400-3. Alternatively, two separate standard support profile rails can be used as two-piece support system, for example, with a width of 35 mm, for a wall construction. The support profile can be formed by a hat profile. The functional components 400-1 to 400-3 are secured laterally to a fixed bearing grounding module 600.

The bridge modules 300 can be implemented in different widths, so that the gap between joined functional components 400-2 and 400-3 can be determined by the bridge module 300-3. This gap defines a ventilation duct between the functional components 400, which comprise, for example, a metal functional housing upper part 421-1 as heat sink. The resulting air channel is used for the lateral cooling of the functional components 400. In addition, a free space between the functional components 400 can be used for cabling that is passed through vertically in the lower housing area, since there is no heat sink there. The bridge modules are secured by means of a module engagement device 301 to the support profile rail 200.

The fixed bearing grounding module 600 fixes the entire system in x direction at a fixed point on the support profile rail 200. By means of this arrangement, starting from a fixed point, a free breathing of the system construction in x direction is possible, as, for example, in the case of heat-caused growth in length. The mechanical clamping of this fixed point constitutes at the same time the central electrical grounding and connection to the support profile rail of the system construction.

Figure 2:
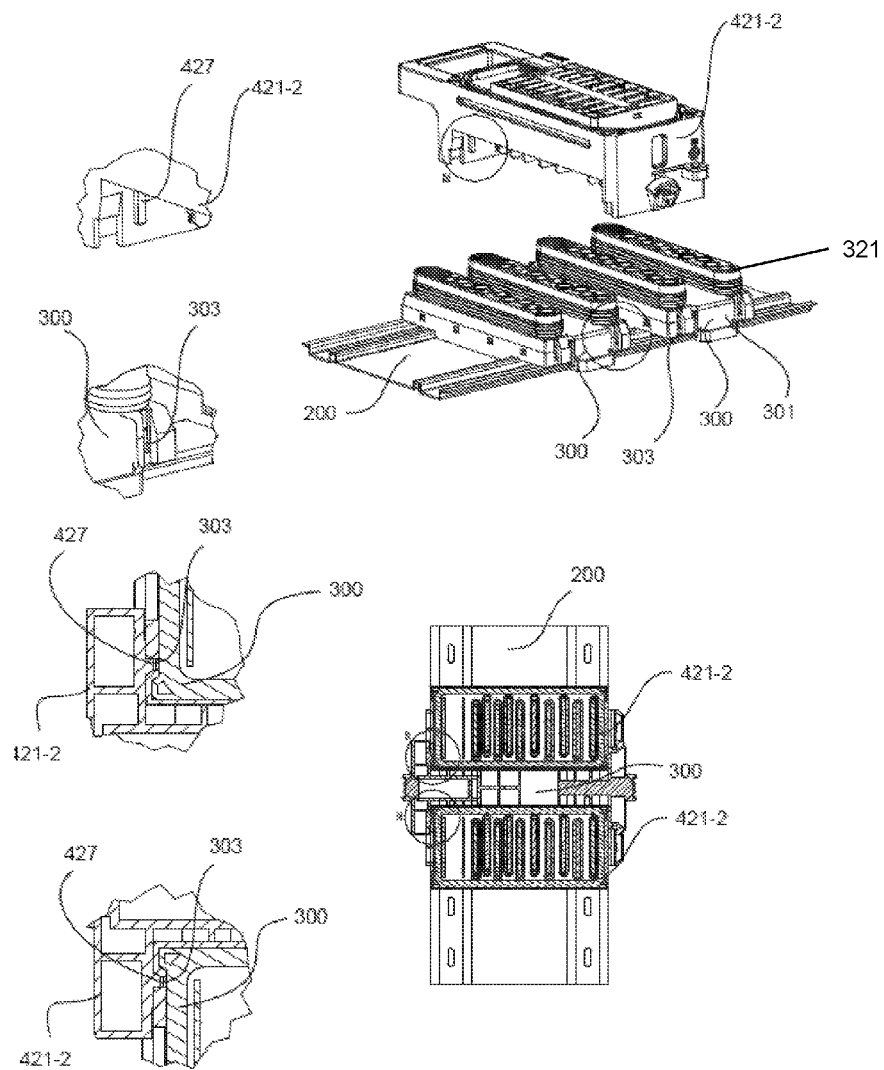
FIG. 2 shows different views of the field bus component with an insert section.

FIG. 2 shows different views of the functional housing lower part 421-2. On the transverse sides, the bridge module 300 comprises in each case two receiving grooves 303 for the insertion of an insert section 427 of a right-side or a left-side functional component 400, in order to absorb tensile forces of the functional components 400 along the support profile rail 200. By means of the insert section 427 of the functional housing lower part 421-2 of the functional component 400 and the receiving groove 303, a positive-locking connection between the functional component 400 and the bridge module 300 is established. As a result, damage to the plug-in sections 321 by tensile forces can be prevented. The insert section 427 protrudes like a web from the housing 421, so that this insert section slides into the receiving groove 303 when the functional component 400 is put on.

For the mechanical uncoupling of the float-mounted electrical plug connection of the bridge modules 300 and the functional components 400, a higher-level mechanical pre-centering takes place. This occurs by the mechanical engagement of the rib-shaped plug-in section 321 which is arranged in the functional component 400, and which engages in the corresponding receiving groove 303 in the bridge module 300 and which fits snugly in each case in the final position in x and y direction.

Figure 3:
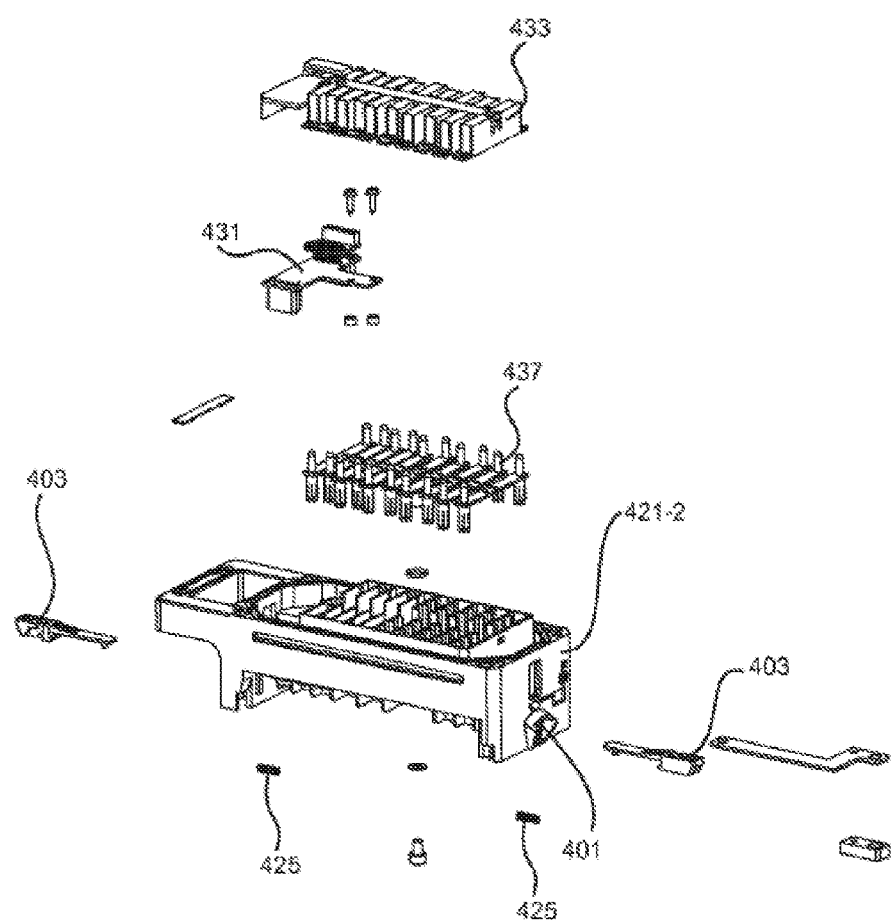
FIG. 3 shows an exploded view of a functional housing lower part.

FIG. 3 shows an exploded view of a functional housing lower part 421-2. The functional housing lower part 421-2 comprises two component securing devices 401 for securing the functional component 400 to the support profile rail 200. The component securing devices 401 each comprise a locking slide for locking the functional housing lower part 421-2 on the support profile rail. In the interior of the functional housing lower part 421-2, several electrical connectors 437 and a data bus plug 431 are arranged. The data bus plug 431 and the electrical connectors 437 are covered by an attachment 433.

The locking slide 403 comprises a compression spring 425 for promoting the movement of the locking slide 403 in the pushed forward locking position, by means of which by the locking slide 403 braces itself against a housing wall of the functional component 400. By means of the compression spring 425, the locking slide is pressed into the pushed forward locking position. The compression spring 425 is arranged between an abutment surface of the locking slide 403 and an abutment surface of the functional housing lower part 421-2.

Figure 4:
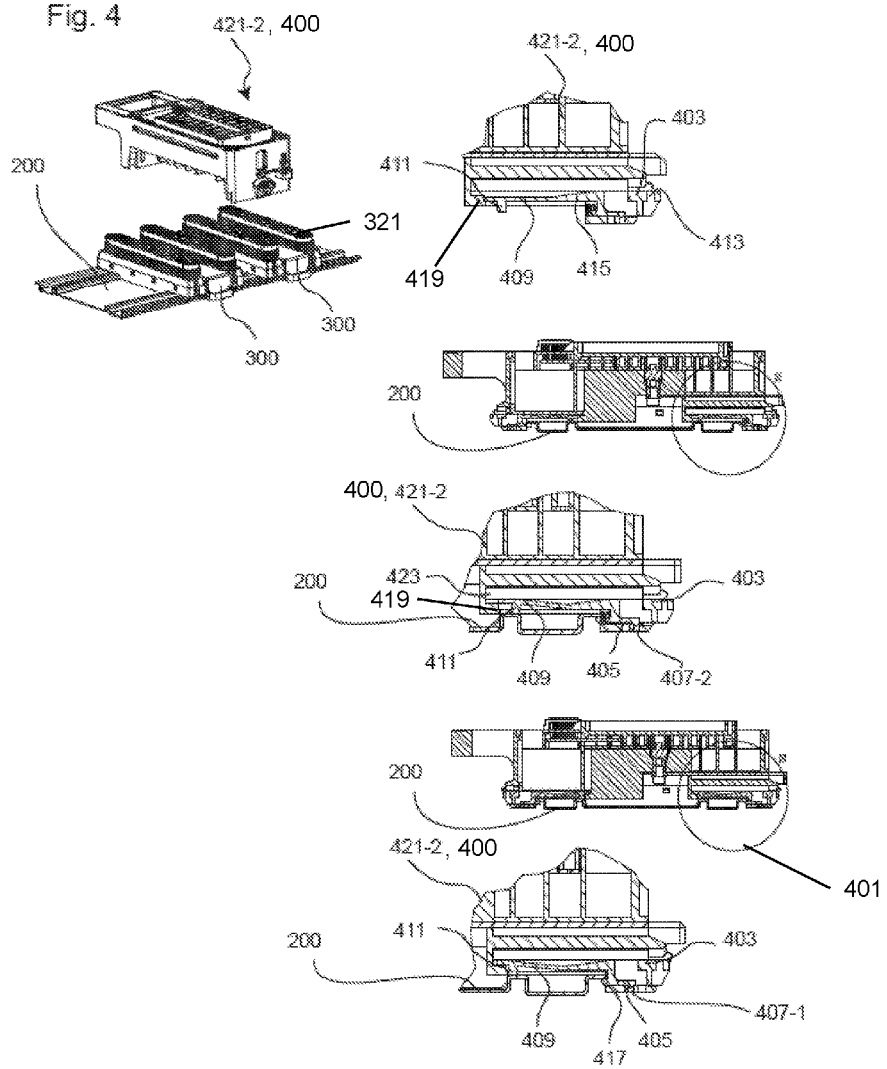
FIG. 4 shows several cross-sectional views through a component securing device.

FIG. 4 shows several cross-sectional views through the component securing device 401 on the functional housing lower part 421-2. The locking slide 403 is arranged so that it can slide on the functional component 400 and it can be moved between a locking position for locking the functional component 400 on the support profile rail 200 and a release position for placement or removal of the functional component 400 onto the support profile rail 200. In the locking position, a securing nose 417 engages behind the support profile rail 200, which results in a form fit. In the release position, the securing nose 417 is retracted.

The locking slide 403 comprises a springy locking arm 405 which, depending on the position, engages in a first locking opening 407-1 or a second locking opening 407-2. As a result, the locking position or the release position can be maintained in engagement. If the locking arm 405 is arranged in the first locking opening 407-1, the locking slide 403 is in the locking position. If the locking arm 405 is arranged in the second locking opening 407-2, the locking slide 403 is in the release position.

The locking slide 403 comprises, in addition, a fixing spring arm 409 for securing the locking slide 403 in the release position, so that the locking slide 403 is held in the release position until the fixing arm 409 is pressed upward. For this purpose, the fixing spring arm 409 of the locking slide 403 abuts against an abutment 419 in the interior of the component securing device 401 and thereby blocks the movement of the locking slide 403. The abutment 419 prevents a sliding of the locking slide 403 in the direction of the locking position.

If the functional component 400 is put on the engagement rail 200, the fixing spring arm 409 is pressed upward by a pressure element 411, so that the fixing spring arm 409 is pressed into a disengage position in which the fixing spring arm 409 can penetrate when the locking slide 403 is slid into the recess 423. In this disengage position, the locking slide 403 can be slid from the release position into the locking position and subsequently it engages in the locking opening 407-1. The pressure element 411 is actuated when the functional component 400 is put on the support profile rail 200, so that the locking by the locking slide 403 can occur only if the functional component 400 is put on. If the pressure element 411 is not actuated by the support profile rail 200, the fixing spring arm 409 abuts against the housing, so that a sliding of the locking slide 405 is blocked.

In order to reinforce the effect and stability of the fixing spring arm 409, a support section 415 is provided, which broadens outwardly in the course of the fixing spring arm 409. In addition, the locking slide 403 comprises an opening 413 for the insertion of a tool, such as a screwdriver, for example, in order to slide the locking slide 403. The locking slide 403 which can be pulled out laterally is formed as a single-piece plastic part, for example.

Figure 5:
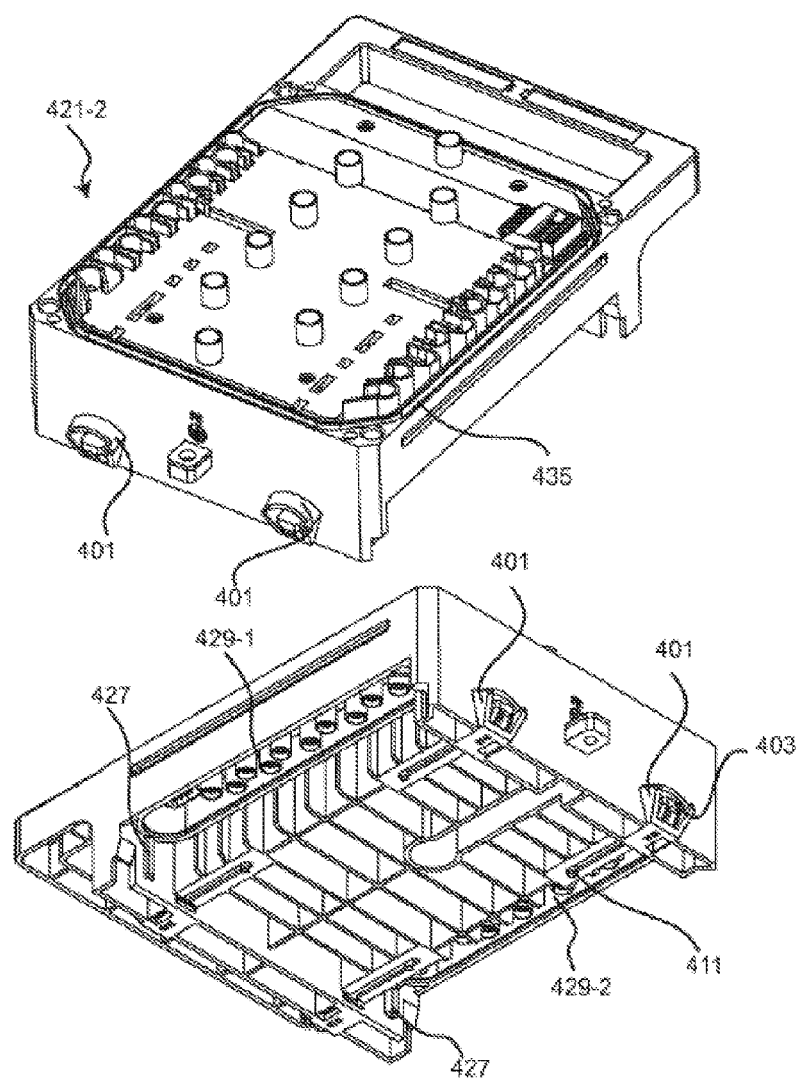
FIG. 5 shows two views of a functional housing lower part of an additional functional component.

FIG. 5 shows two views of a functional housing lower part 421-2 of an additional functional component 400. The functional housing lower part 421-2 comprises a peripheral recess 435 for the insertion of a sealing ring which mutually seals the functional housing lower part 421-2 and the functional housing upper part 421-1. On each side of the functional housing lower part 421-2, two component securing devices 401 are arranged in each case, by means of which the functional housing lower part 421-1 is secured to the support profile rail. The pressure elements 411 of the locking slide 403 protrude on the bottom side of the functional housing lower part 421-1, so that said elements can be actuated when the support profile rail 200 is put on the support profile rail 200.

Moreover, on the bottom side of the functional housing lower part 421-2, two recesses 429-1 and 429-2 are provided. The electrical plug-in sections of the bridge module 300 are inserted into the recesses 429-1 and 429-2. The plug-in section of a first bridge module 300 is inserted into the recess 429-1. The plug-in section of a second bridge module is inserted into the recess 429-2.

Figure 6:
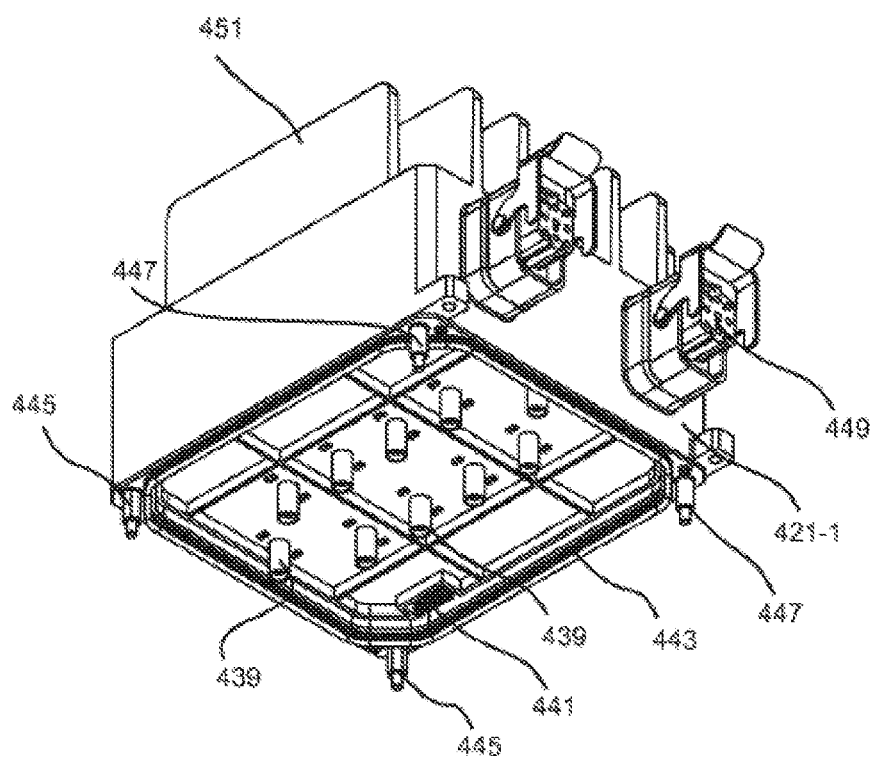
FIG. 6 shows a view of a functional housing upper part.

FIG. 6 shows a view from below of the functional housing upper part 421-1. On the bottom side of the functional component upper part 421-1, plug contacts 439 are located as interface for the establishment of a connection with the functional component upper part 421-2. In addition, the bottom side of the functional component upper part 421-1 comprises a data bus interface 441, which is connected to the functional component upper part 421-1 during the placement of the functional component upper part 421-2. In addition, on the bottom side of the functional component upper part 421-1, the sealing element 443 with the hexagonal segments 445 and the cylindrical segments 447 is placed, which are inserted in the respective hexagonal recesses and cylindrical recesses. Laterally, on the functional component upper part 421-1, additional plug contacts 449 are arranged for the connection of cables.

In addition, the functional component upper part 421-1 can comprise one or more closable openings for the connection of an electrical line or of a cable, portholes, switch breakthroughs for connections, sockets, switches or a heat sink 451 with cooling ribs. The housing of the functional component upper part 421-1 can be produced from a metal material, a plastic, or a composite.

The functional component upper part 421-1 can perform different functions. The functional component upper part 421-1 can comprise active and passive elements, and it can be used, for example, as a frequency inverter or power supply or for signal distribution. In the functional component upper part 421-1, electrical inputs and/or outputs, plug connections or displays can be arranged for this purpose. In addition, the functional component upper part 421-1 can comprise a heat sink for the dissipation of heat and/or a porthole and/or a cover and/or a switch and/or at least one lamp for displaying operating states. A locking hook can be used for overlapping or blocking a functional component located under the functional component upper part 421-1.

The field stations can be operated by using a simple input as terminal devices of a conventional star distribution, or by using a connection and distribution module (CD module), for participants or nodes of an energy distribution network. Switching devices and protection devices, motor switches, bus couplers or I/Os, etc., can be arranged in free, function-determined order on the left and right of the CD module. In this manner, advantages are achieved in the engineering by means of a visible separation of extra-low-voltage and low-voltage components. Several field station, as participants, can define a network in any structure such as, for example, a line, a tree or a ring structure.

A central switch cabinet within the laid out performance range of the energy distribution is no longer needed. Due to an appropriate design of the data buses that are used at the same time, the order and the positions of individual components of the field station can be checked before the start of operation for correct arrangement according to plans (Remote Putting into Service, Remote Service).

The component construction system 100 allows a construction of "smart" installation networks for direct current and alternating current, and distributions without switch cabinets in appropriate installation layouts. The component construction system can be used in the application fields of installation or energy distribution. In the case of a distributed automation, a construction of a modular field station as functional nodes in "smart" installation networks is possible. In alternative switch cabinet concepts, a construction of modular stations in the switch cabinet without current rails and without control wiring with identical projection for IP20 . . . IP6x is possible.

By means of the component construction system 100, modular motor switches in the field with a high degree of protection can be developed. By means of the component construction system 100, in addition, an integral construction concept (Power & Drive, P&D) is developed, which solves the problem of an advantageous distribution and provision of energy in the field, for example, outside of a switch cabinet.

The modularity of the component construction system 100 allows the expansion of application beyond the modular field station to "smart" energy distribution and to an alternative switch cabinet construction. In addition, a coverage of the spectrum of stand-alone functional components as terminal devices in a conventional star-shaped energy distribution can be achieved. The component construction system 100 allows a flexible construction of modular systems in the field (IP6x) and inside or outside of a switch cabinet on standard support profile rails (IP20). In a preliminary installation, a preliminary wiring on a mounting rack can occur.

All the features explained and shown in connection with individual embodiments of the invention can be provided in different combinations in the subject matter according to the invention in order to implement the advantageous effects thereof simultaneously.

The scope of protection of the present invention is given by the claims and is not limited by the features explained in the description or shown in the figures.

LIST OF REFERENCE NUMBERS

100 Component construction system
200 Support profile rail
300 Bridge module
301 Module engagement device
303 Receiving groove
400 Functional component
401 Component securing device
403 Locking slide
405 Locking arm
407-1 Locking opening
407-2 Locking opening
409 Fixing spring arm
411 Pressure element
413 Opening
415 Support section
417 Securing nose
419 Abutment
421-1 Functional housing upper part
421-2 Functional housing lower part
423 Recess
425 Compression spring
427 Insert section
429 Recess
431 Data bus plug
433 Attachment
435 Recess
437 Electrical connector
439 Plug contacts
441 Data bus interface
443 Sealing element
445 Hexagonal segments
447 Cylinder segment
449 Plug contacts
451 Heat sink

The invention claimed is:

1. A functional component for a component construction system for electrical connection to a bridge module, comprising:
   a housing with a component securing device for securing the functional component to a support profile rail,
   wherein the housing comprises at least one recess for the insertion of an electrical plug-in section of the bridge module, and
   wherein the functional component comprises an insert section for insertion in a receiving groove of the bridge module, the insert section adapted to absorb tensile forces of the functional component along the support profile rail.

2. The functional component according to claim 1, wherein the housing is composed of a functional housing lower part and a functional housing upper part.

3. The functional component according to claim 2, wherein a peripheral sealing ring is arranged between the functional housing lower part and the functional housing upper part.

4. The functional component according to claim 2, wherein the functional housing upper part comprises a frequency inverter or a power supply.

5. The functional component according to claim 4, wherein the functional component comprises a first recess for insertion of a first electrical plug-in section and a second recess for the insertion of a second electrical plug-in section.

6. The functional component according to claim 5, wherein the functional component comprises a first insert section on a first housing side and a second insert section on an opposite housing side.

7. The functional component according to claim 1, wherein the functional component comprises a first component securing device for a first support profile of the support profile rail and a second component securing device for a second support profile of the support profile rail.

8. The functional component according to claim 1, wherein the component securing device comprises a slidable locking slide for engaging under the support profile rail.

9. The functional component according to claim 7, wherein a locking slide can be slid on the functional component between a pushed forward locking position for engaging under the functional component on the support profile rail and a retracted release position for placement of the functional component on the support profile rail.

10. The functional component according to claim 8, wherein the locking slide comprises a pressure spring for assisting the movement of the locking slide in the pushed forward locking position.

11. The functional component according to claim 8, wherein the locking slide comprises a locking arm for the engagement of the locking slide in the locking position and for the engagement of the locking slide in the release position.

12. The functional component according to claim 8, wherein the locking slide comprises a fixing spring arm for the fixing of the locking slide in the release position.

13. The functional component according to claim 1, wherein the functional component, in particular a functional housing upper part, comprises a heat sink for the dissipation of heat.

* * * * *